United States Patent [19]

Walsh

[11] Patent Number: 4,594,578
[45] Date of Patent: Jun. 10, 1986

[54] ONE SHOT PULSE WIDTH MODULATING CONVERTER

[75] Inventor: Thomas J. Walsh, Hatboro, Pa.

[73] Assignee: General Signal Corporation, Stamford, Conn.

[21] Appl. No.: 643,210

[22] Filed: Aug. 22, 1984

[51] Int. Cl.⁴ .............................................. H03M 1/12
[52] U.S. Cl. ......................... 340/347 AD; 340/347 M; 307/353; 307/265
[58] Field of Search ................ 340/347 AD; 307/353, 307/265

[56] References Cited

U.S. PATENT DOCUMENTS 3,599,203  8/1971  Conley .................... 340/347 AD

OTHER PUBLICATIONS

"Bipolar and MOS Analog Integrated Circuit Design", Alan B. Grebene, Wiley & Sons, 1984.

Primary Examiner—William M. Shoop, Jr.
Assistant Examiner—Saul M. Bergmann
Attorney, Agent, or Firm—William G. Miller, Jr.; Harold Huberfeld

[57] ABSTRACT

A one shot voltage to pulse width converter is provided for producing a digital representation of an analog input signal voltage. The circuit includes an integrating amplifier circuit whose output is kept at a reference potential except when it is being ramped up in response to connection of an input signal to the integrating amplifier during a fixed input sample period or down after the fixed input sample period expires. The circuit also includes a comparator connected to compare the output of the integrating amplifier to the reference potential with the output of the comparator switching an output circuit between two different levels so that the pulse width of the output is related to the magnitude of the input signal. When the input signal is not connected to the integrating amplifier its output is held at reference potential by a negative feedback from the comparator output to the integrating circuit input.

7 Claims, 3 Drawing Figures

ONE SHOT PULSE WIDTH MODULATING CONVERTER

BACKGROUND OF THE INVENTION

This invention relates to analog to pulse width converters such as are used in analog to digital converters, and more particularly this invention relates to one shot converters, that is to converters which make a single conversion on command.

One shot converters are useful for performing the conversion process in multi-point recorders, for example. In these recorders it is necessary to sequentially scan the analog values of a plurality of points and convert the single reading taken on each point to corresponding digital values for display and recording.

It is an object of this invention to provide a simple and easily manufactured one shot analog to pulse width converter.

SUMMARY OF THE INVENTION

A one shot voltage to pulse width converter is provided for producing a digital representation of an analog voltage. The circuit includes an integrating amplifier circuit whose output is kept at a reference potential except when it is being ramped up in response to an input signal or down after the fixed input sample period expires. The circuit also includes a comparator connected to compare the output of the integrating amplifier to the reference potential with the output of the comparator switching an output circuit to a different level at the beginning of the sample period when the amplifier output is being ramped up at a rate related to the input signal and switching back after the amplifier output has ramped back down to the reference potential. A feedback circuit is provided between the output of the comparator and the input of the integrating amplifier to hold the reference potential on the output of the integrating amplifier so as to provide for the circuit a stable condition between the sampling periods.

DESCRIPTION OF THE PREFERRED EMBODIMENTS

In one form analog to digital converters follow the procedure of integrating the unknown value for a predetermined fixed period so that the output of the integrator ramp up to a value which will be related to the value of the input signal and then the output is allowed to ramp down to its original value. With this method the time duration of the ramping down is directly proportional to the value of the input signal. In recent converter circuits, such as that shown in U.S. Pat. No. 4,390,796, of which I am a coinventor, a microprocessor is utilized to count the time of the ramping with that count becoming the digital value corresponding to the value of the analog input signal.

Figure 1:
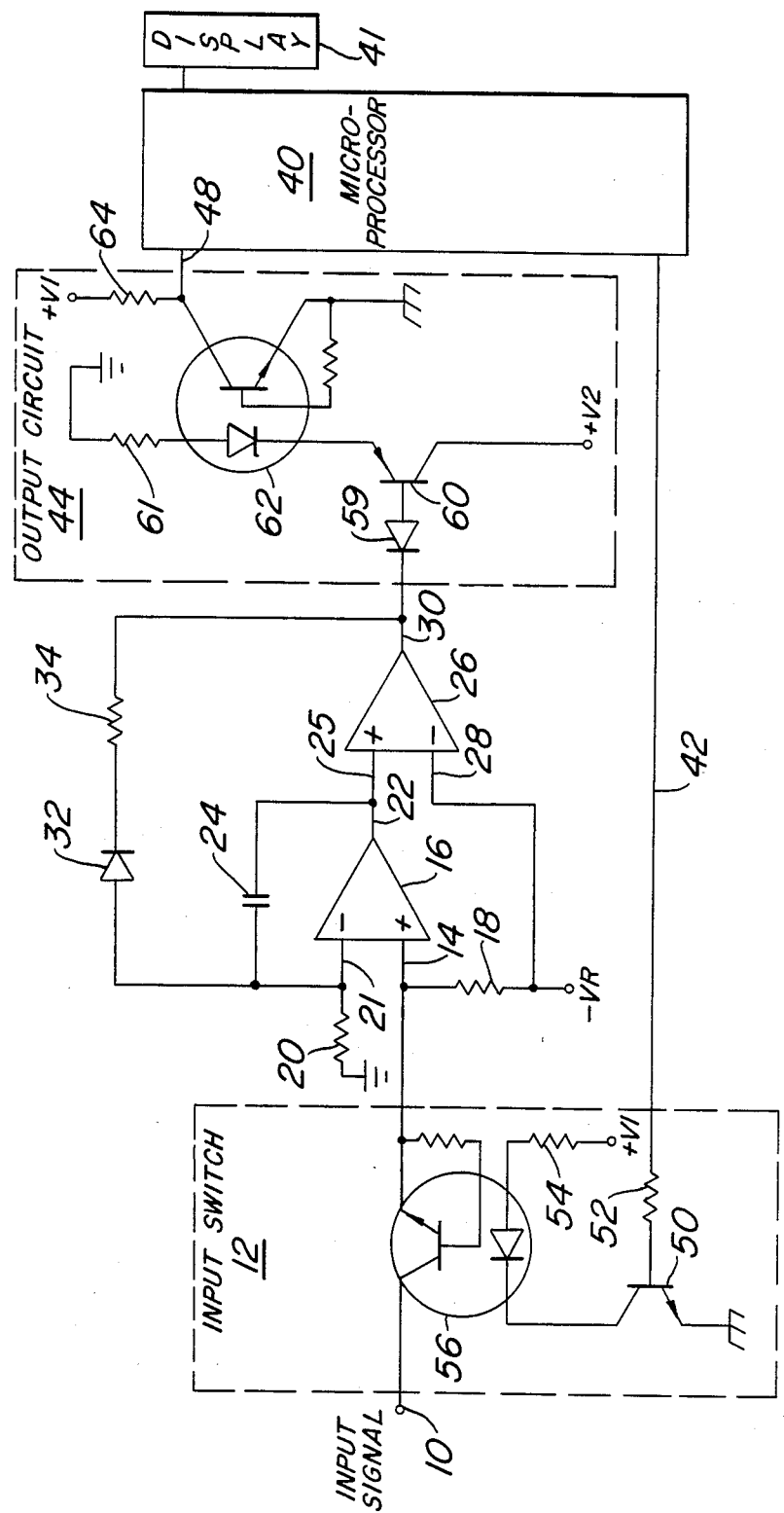
FIG. 1 is a circuit diagram showing one form of the circuit of this invention.

In FIG. 1 the analog input signal which is to be converted appears at input terminal 10 on the input of input switch 12 which serves to switch the input signal to connection with the non-inverting input line 14 of differential amplifier 16. The non-inverting input of the amplifier is also connected to a reference voltage VR here shown having a negative potential and being applied to the input 14 through the resistor 18. Thus, when the input switch 12 is open, the non-inverting input 14 of the amplifier 16 is normally at the reference potential.

The inverting input line 21 of the amplifier 16 is connected to ground through resistor 20. The inverting input is also connected to the amplifier output line 22 to form a first negative feedback circuit which includes a capacitor 24 so that the amplifier circuit operates as an integrating circuit. The output of the amplifier will then be representative of the time integral of the input signal during the period when the input signal is connected to the non-inverting input 14.

The output of the integrating amplifier 16 is connected to the non-inverting input line 25 of differential amplifier 26 which is serving as a comparator in this circuit. The amplifier 26 operates as a comparator in that it compares the potential on the non-inverting input line 25 to that on the inverting input line 28. As shown, the inverting input is connected to the reference potential $-VR$. Thus, when the input to the non-inverting input 25 is more positive than the reference potential the output on output line 30 is positive, whereas if the input on line 25 is below the reference potential, the output on line 30 is negative.

By connecting the output 30 of the comparator 26 to the inverting input 21 of amplifier 16 a second negative feedback circuit is formed. As shown, this second feedback circuit includes a diode 32 in series with a resistor 34. The diode 32 is connected so that feedback current is allowed to flow when the output of the integrating circuit is not ramping, that is when it is in a stable hold condition. In the circuit of FIG. 1, the output of the integrating amplifier is at the reference potential $-VR$ when the input signal is not connected to the integrating amplifier through the input switch 12. Thus, the output of amplifier 26 will be negative and current will flow in the diode 32, resistor 34 and resistor 20. The drop through resistor 20 due to that current will keep the inverting input of amplifier 16 also at the reference potential so that it will match the potential at the non-inverting input 14. The amplifier will thus be in the stable holding state prior to connection of the input signal to the amplifier 16.

Figure 2:
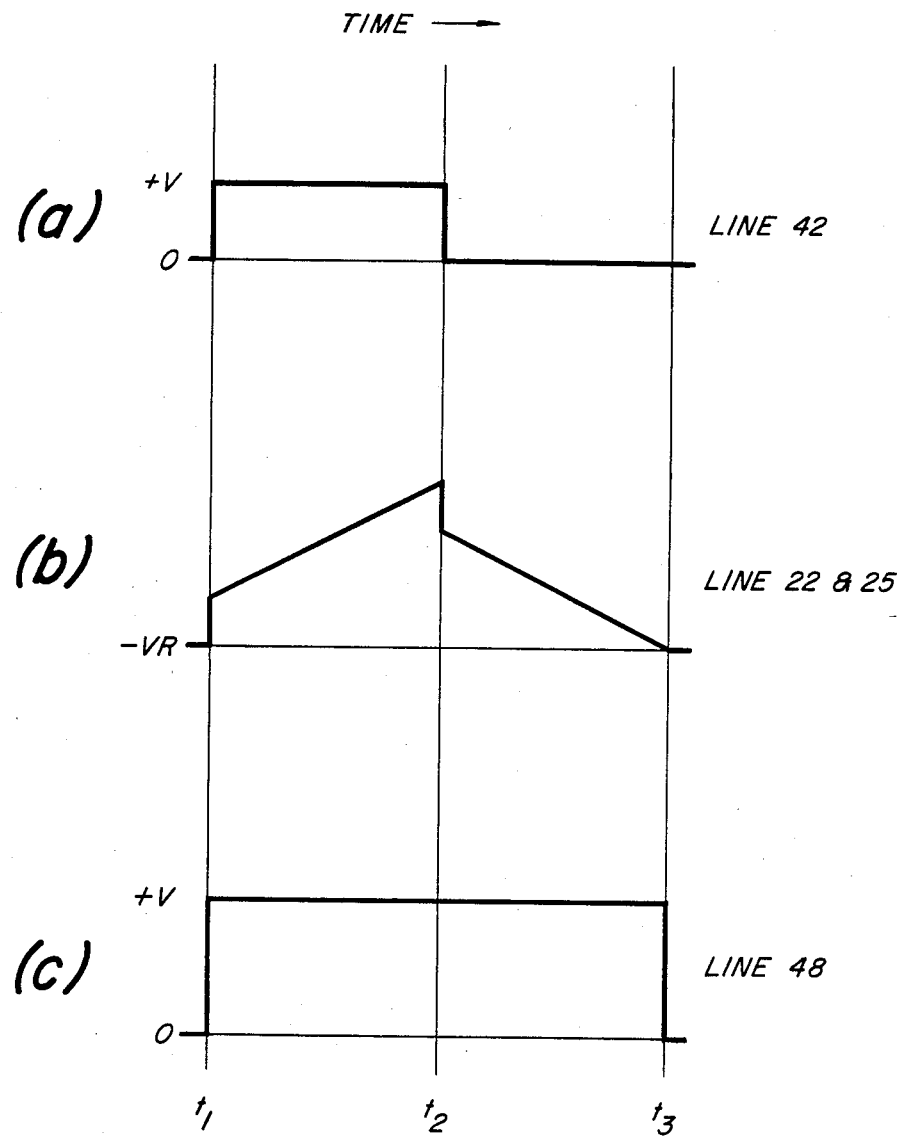
FIG. 2 is a graphical representation of the signals which appear in certain parts of the circuit.

Periodically, the microprocessor 40 will produce a sampling pulse on line 42 which will cause the input switch 12 to complete the connection between the input terminal 10 and amplifier 16 for the desired period of time. This sampling pulse may be as shown in FIG. 2(a), and the period may, for example, be for a duration equal to one or two periods of the power source. Preferably a duration of two periods is used, as shown in FIG. 2, (33.33 milliseconds for example) in order to gain added noise rejection in the process. With a positive input signal, as shown in FIG. 2(a), connected to the input line 14 the output at 22 will be positive as will the output at 30. Thus, the diode 32 will be back biased and the current which flows in resistor 20 will be the current flowing in capacitor 24. Thus, the output of amplifier 16 will initially (at time t1) jump up by an amount equal to the input signal and will then ramp up at a rate depending on the magnitude of the input signal due to the charging of capacitor 24. This ramp is illustrated in FIG. 2(b), between t1 and t2.

When the output on line 22 goes more positive than the reference potential, the output on line 30 goes positive triggering the output circuit 44 so that it produces on line 48 a change in level, as shown in FIG. 2(c) at time t1. At the end of the sample period (t2) the input signal will be cut off and the upward ramping will stop, as shown in FIG. 2(b). The diode 32 will, however, remain backbiased, and after an initial step downward equal to the previous step up the capacitor 24 will discharge through resistor 20 causing the output of amplifier 16 to ramp down at a rate dependent on the magnitude of the reference potential VR. This ramping down will continue until the potential applied to the non-inverting input of amplifier 26 goes slightly negative with respect to the reference potential. At that time (t3) the output of amplifier 26 will go negative and the output of circuit 44 will return to its original level, as shown in FIG. 2(c).

The time period (t1–t3) in FIG. 2(c) is the pulse width of the waveform shown. It will be evident from the above description that the time period (t2–t3) will be directly related to the magnitude of the input signal. This can be determined by the microprocessor 40 by counting for the period (t2–t3) as, for example, by starting the count at t2 in response to the negative going edge of the waveform of FIG. 2(a), which is the potential on line 42, and then ending the count with the negative going edge of the waveform of FIG. 2(c). Alternatively, the pulse width (t1–t3) minus the period of connection of the input signal (t1–t2) will give the remaining period (t2–t3) which is proportional to the analog input signal value. All of these calculations are of utmost simplicity for the microprocessor 40 and therefore are not disclosed in further detail here. The results of the calculation regardless of how made can be displayed on display 41.

As will be evident from the following description of the input switch 12 and the output circuit 44, it is useful to use optical isolators to couple signals between analog circuitry and digital circuitry to prevent problems from common mode signals.

In the input switch 12, the base of the transistor 50 is driven positive through resistor 52 during the period of the sampling pulse on line 42, as shown in FIG. 2(a). The resulting current through resistor 54 and the diode of optical isolator 56 will turn on the optical isolator causing a completion of the circuit through the transistor part of the isolator. The result is a completion of the connection of the input signal source 10 to the non-inverting input 14 of amplifier 16.

When the output of the comparator 26 goes up, transistor 60 is shut off by voltage applied through diode 59, thus stopping the current flow through the resistor 61 and the transistor of optical isolator 62 with a resulting turning off of the transistor part of isolator 62. That action will cause line 48 to go up, as shown at t1 in FIG. 2(c), due to the stopping of current flow through resistor 64.

Figure 3:
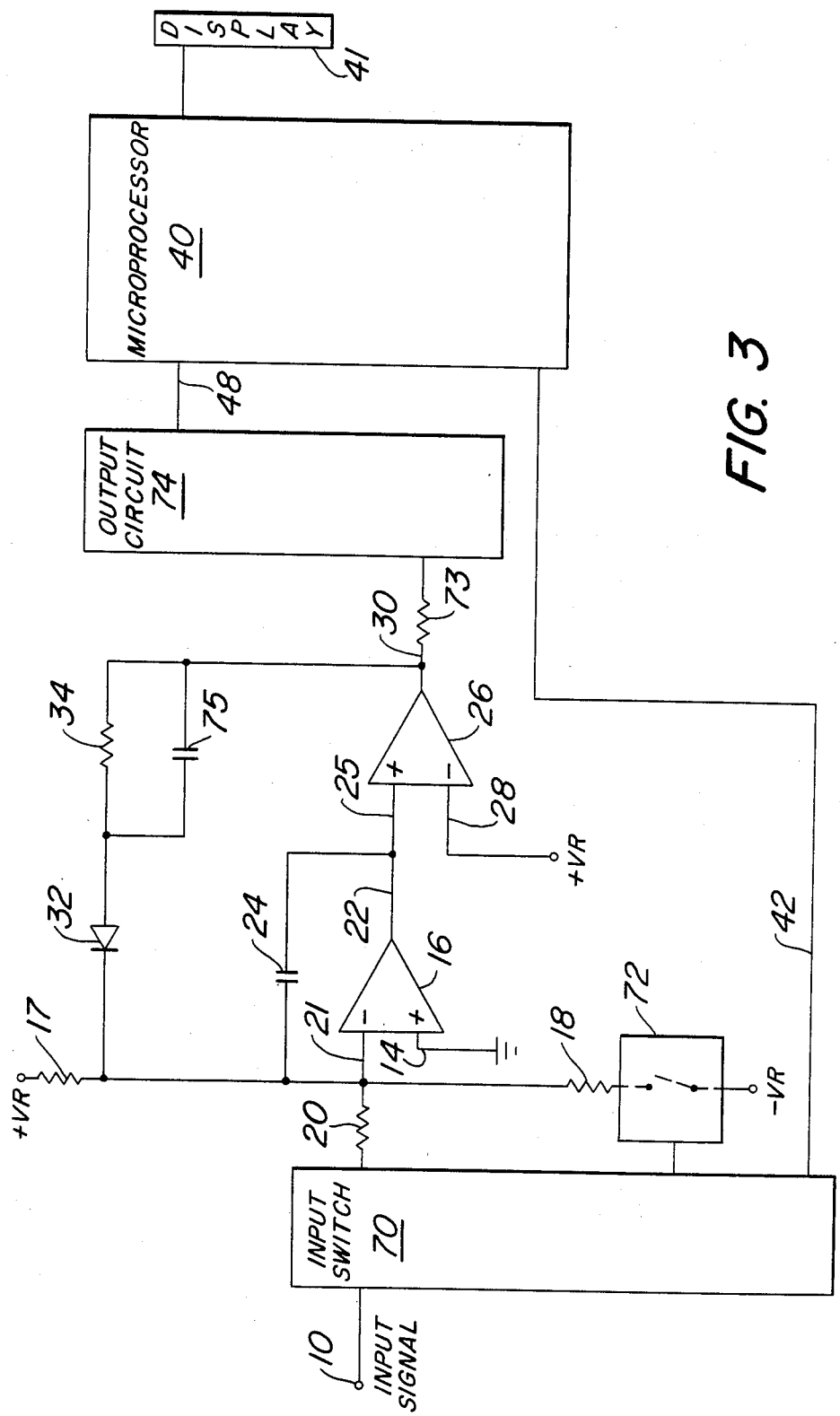
FIG. 3 is a circuit diagram showing another form of the circuit of this invention.

In FIG. 3, there is shown another circuit which can be used to produce essentially the same type of one shot pulse width modulating converter as is disclosed in FIG. 1. In FIG. 3, however, the input signal is introduced into the integrating amplifier circuit at inverting input 21, and the non-inverting input is at ground potential.

The input switch 70 of FIG. 3 would be similar to the input switch 12 of FIG. 1, except that in addition to connecting the input signal to inverting input 21 during the sample period, it would also operate switch unit 72 to disconnect the reference potential VR, which is here shown as having a negative potential, from the resistor 18 during the sampling period. By introducing the input signal to the inverting input 21, the step changes shown in the waveform of FIG. 2 (b) will be eliminated.

During the period when the circuit of FIG. 3 is in a hold condition, before the input signal is connected to the amplifier 16, there is a current flow from the source +VR to −VR through resistors 17 and 18. In addition, there is a current flow through the second feedback circuit, which includes resistor 34 and diode 32, and thence through resistor 18. This current is the holding current which will maintain the inverting input of amplifier 16 at ground potential to match the potential of the non-inverting input. The output of amplifier 16 is then at the potential necessary to maintain the holding current. This potential will be slightly positive of +VR.

With a connection of the input signal and a disconnection of the resistor 18 from the source −VR the output of amplifier 16 will ramp down from a potential slightly positive of +VR in response to a positive input signal. The capacitor 24 will charge until the end of the sampling period, at which time the capacitor will discharge until the output of amplifier 16 goes slightly positive of +VR again. During the ramping of the output of amplifier 16, the output of the comparator 26 will be negative, so as to bias the diode 32 off. At the end of the ramping period the diode will again be biased on to provide the holding current. Thus, a negative signal on output line 30 will cause the output on line 48 to go-positive and the return of the potential on line 30 to a positive value will cause the output on line 48 to return to its original value, as was the case with the circuit of FIG. 1. The output circuit 74 of FIG. 3 will be similar to that of FIG. 1, except that the transistor instead of being a PNP type will be an NPN type to take care of the different polarities present in the circuit of FIG. 3. A resistor 73 has been added to the circuit to accommodate the NPN connection.

A small capacitor 75 is shown in FIG. 3 connected in parallel to resistor 34. This capacitor has been added to help in preventing oscillations in the circuit.

What is claimed is:

1. A single shot pulse width modulating converter for converting the voltage amplitude of an input signal to a voltage pulse of width proportional to the amplitude of said input signal, comprising:

a source of reference potential;

an integrating amplifier circuit;

a comparator connected to compare the output of said integrating amplifier to said reference potential;

a first switching means operable to connect said input signal as an input to said integrating amplifier during a periodic fixed sampling period;

a feedback circuit connected between the output of said comparator and the input of said integrating amplifier so that the current in said feedback circuit will maintain the output of the integrating amplifier circuit at said reference potential when the output of said comparator is of one polarity, said feedback circuit including switchable means operable to maintain disconnected when the output of said comparator is of an opposite polarity; and an output circuit connected to the output of said comparator and operable to produce as a final output signal a voltage waveform which changes state with a change in polarity of said comparator output signal so that the pulse width of said final output signal is related to the voltage amplitude of the input signal.

2. A single shot pulse width modulating converter for converting the voltage amplitude of an input signal to a voltage pulse of width proportional to the amplitude of said input signal, comprising:

a source of reference potential;

an integrating amplifier circuit connected to receive said input signal and operable so that with said input signal disconnected from said integrating amplifier said amplifier produces said reference potential on its output and upon connection of said input signal produces on its output a potential which ramps in one direction until said input signal is disconnected and then ramps in the opposite direction until the output again reaches the reference potential;

a comparator connected to compare the output of said integrating amplifier to said reference potential and to produce at its output signal which changes from one polarity, indicative that the output of said integrating amplifier has returned to said reference potential, to an opposite polarity, indicative of the fact that the output of said integrating amplifier is in the process of ramping;

a first switching means operable to connect said input signal as an input to said integrating amplifier during a periodic fixed sampling period;

a feedback circuit connected between the output of said comparator and the input of said integrating amplifier so that the current in said feedback circuit, when the output of said comparator is of said one polarity, maintains the output of said integrating amplifier at said reference potential, said feedback circuit including switchable means operable to maintain said feedback circuit disconnected when the output of said comparator is of said opposite polarity; and an output circuit connected to the output of said comparator and operable to produce as a final output signal a voltage waveform which changes state with a change in polarity of said comparator output signal so that the pulse width of said final output signal is related to the voltage amplitude of the input signal.

3. A converter as set forth in claim 2, in which
the integrating circuit includes a differential amplifier having a negative feedback circuit with a capacitor, and
the comparator includes a differential amplifier having its non-inverting input connected to the output of said integrating circuit.

4. A converter as set forth in claim 3, in which
the integrating amplifier has its non-inverting input connected to the reference potential, and
the comparator has its inverting input connected to the reference potential.

5. A converter as set forth in claim 2, in which
the input switch connects the input signal to the non-inverting input of the integrating amplifier.

6. A converter as set forth in claim 2, in which
the input switch connects the input signal to the inverting input of the integrating amplifier.

7. A single shot analog to digital converter, comprising:

a first differential amplifier having an inverting input, a non-inverting input, and an output with a reference potential connected to said non-inverting input and a capacitor connected in a first negative feedback loop between said output and said inverting input so that said first amplifier will act as an integrating amplifier;

a second differential amplifier having an inverting input, a non-inverting input, and an output, one of said inputs of said second amplifier being connected to the output of said first amplifier with the other of said inputs of said second amplifier being connected to a reference potential so that said second amplifier will act as a comparator;

a second negative feedback circuit connected between the output of said second amplifier and the inverting input of said first amplifier to provide a feedback current effective to maintain said first amplifier in a hold condition when said input signal is disconnected from said first amplifier and said capacitor is discharged, said second negative feedback circuit including a switching element operable to cause said second feedback circuit to be cut off when said input signal is connected to said first amplifier; and input switching means operable to switch an analog voltage input signal into connection with one of the said inputs of said first amplifier during periodic fixed sampling periods to cause said first amplifier to charge said capacitor in one direction to integrate said input signal for said sampling period whereby the output of said first amplifier ramps in one direction from the value of the reference potential for said period so that said first amplifier output arrives at a value which differs from the reference potential by an amount proportional to said input signal and upon termination of said sampling period said capacitor discharges to cause the output of said first amplifier to ramp in an opposite direction until it arrives back at the reference potential.

* * * * *